(12) United States Patent
Vásárhelyi et al.

(10) Patent No.: US 8,974,094 B2
(45) Date of Patent: Mar. 10, 2015

(54) DEVICE AND METHOD FOR COUPLING A LIGHT SOURCE TO A PRINTED CIRCUIT BOARD IN LAMPS

(71) Applicant: General Electric Company, Schenectady, NY (US)

(72) Inventors: Tamás Vásárhelyi, Budapest (HU); József Fülöp, Budapest (HU); Tímea Seszták, Budapest (HU); Zsolt Bagoly, Budapest (HU); Jácint Gergely, Budapest (HU)

(73) Assignee: General Electric Company, Schenectady, NY (US)

( * ) Notice: Subject to any disclaimer, the term of this patent is extended or adjusted under 35 U.S.C. 154(b) by 236 days.

(21) Appl. No.: 13/778,488

(22) Filed: Feb. 27, 2013

(65) Prior Publication Data

US 2014/0240992 A1    Aug. 28, 2014

(51) Int. Cl.
| | |
|---|---|
| F21V 19/00 | (2006.01) |
| F21K 99/00 | (2010.01) |
| F21V 23/00 | (2006.01) |
| H05K 1/00 | (2006.01) |
| H01R 12/51 | (2011.01) |

(52) U.S. Cl.
CPC .............. *F21K 9/90* (2013.01); *F21V 23/004* (2013.01); *H05K 1/00* (2013.01); *H01R 12/515* (2013.01)
USPC ............................... 362/382; 29/825; 29/846

(58) Field of Classification Search
CPC ...... F21V 23/00; F21V 23/001; F21V 23/004; F21V 23/006; F21V 21/00; H01L 33/62; F21K 9/1355
USPC .................................... 362/382; 29/825, 846
See application file for complete search history.

(56) References Cited

U.S. PATENT DOCUMENTS

| | | | | |
|---|---|---|---|---|
| 5,828,170 | A | * | 10/1998 | Nishio et al. .................. 313/493 |
| 6,045,365 | A | | 4/2000 | Kihara |
| 7,394,189 | B2 | | 7/2008 | Kitagawa et al. |
| 7,892,031 | B1 | * | 2/2011 | Mostoller et al. ............. 439/611 |

* cited by examiner

*Primary Examiner* — Andrew Coughlin
(74) *Attorney, Agent, or Firm* — GE Global Patent Operation; Peter T. DiMauro

(57) ABSTRACT

A lamp includes a collar with internal and outer surfaces, where two or more connection pins extend from the internal surface of the collar. At least two connection pins have a head portion distal from the collar internal surface. The head portions include a slot. The lamp includes a light source with at least two external lead-in wires. The lead-in wires are located within respective slots and are mechanically coupled to respective surfaces of the slots in a press-fit manner which may be free of wrapping, winding, twisting, or soldering. A PCB disposed inside the lamp has two opposing surfaces and a rim between the two opposing surfaces. There are conductive surfaces disposed on at least one of the rim and one of the opposing surfaces at positions corresponding to connection pin slots. The PCB is located between connection pins with the conductive surfaces in electrical communication with the lead-in wires.

17 Claims, 7 Drawing Sheets

DEVICE AND METHOD FOR COUPLING A LIGHT SOURCE TO A PRINTED CIRCUIT BOARD IN LAMPS

BACKGROUND

Lamps can generate light from a variety of light source technologies—for example, incandescent, light emitting diode (LED), compact fluorescent (CFL), high intensity discharge (HID), etc. Each of these light source technologies can have differing requirements for electrical supply—e.g., an incandescent light source can operate from line voltage; LED, CFL and HID can each require an electric input conditioning circuit with different properties (a direct current supply, a transformer, a ballast, etc.).

Each of the variety of light source technologies can be incorporated into commercially available lamp products that include the light source, a plastic housing, a collar, and a conductive base. The conductive base is configured to mate electrically with a complementary socket—for example, a screw-type socket, a bayonet socket, pin socket, etc.

Lead-in wires extending from the light source are electrically coupled to either the electric input conditioning circuit or to the base. This electrical coupling of the lead-in wires is accomplished by wrapping, or winding, the lead-in wires about a conductive pin. In some implementations the conductive pin can be a wire-like component that is easily bent so that it and the lead-in wires can be twisted together. The lead-in wires can alternatively be soldered to connection pads.

DETAILED DESCRIPTION

In accordance with embodiments, within a lamp the lead-in wires extending from the body of a light source can be connected to a PCB located within the collar or the plastic housing without wrapping, winding, twisting, and/or soldering the lead-in wires. In some light source technologies the wires can have a polarity aspect (i.e., input vs. output), however, the term "lead-in wire" refers to both herein without making such distinction.

Figure 1:
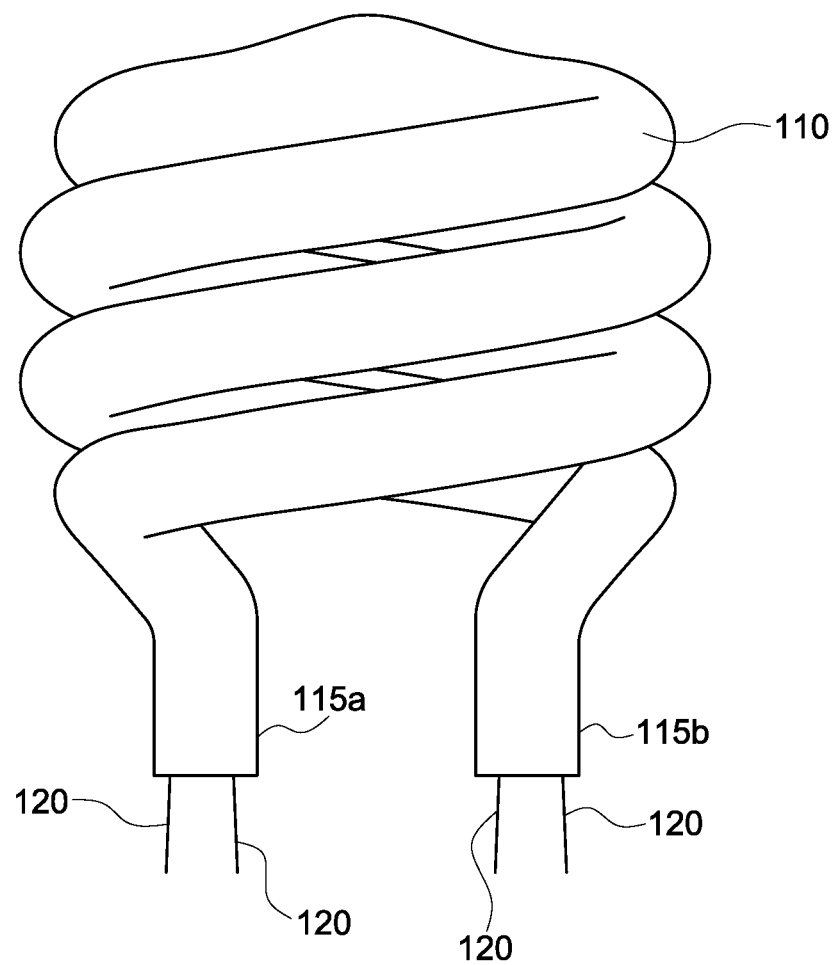
FIG. 1 depicts a compact fluorescent discharge tube.

FIG. 1 depicts CFL discharge tube 110 which encloses a discharge volume filled with a discharge gas, where discharge tube ends 115a, 115b are sealed in a gas tight manner to form an arc path. Disposed internal to the discharge tube, and at respective tube ends, are electrodes. Protruding from each of discharge tube ends 115a, 115b are two lead-in wires 120. The lead-in wires are connected through the gas tight seal at each end of the discharge tube to respective electrodes. Other light source technologies each have at least a pair of lead-in wires extending from the light source body (e.g., the CFL discharge tube). Embodiments disclosed herein are readily implemented on any light source technology.

Figure 2:
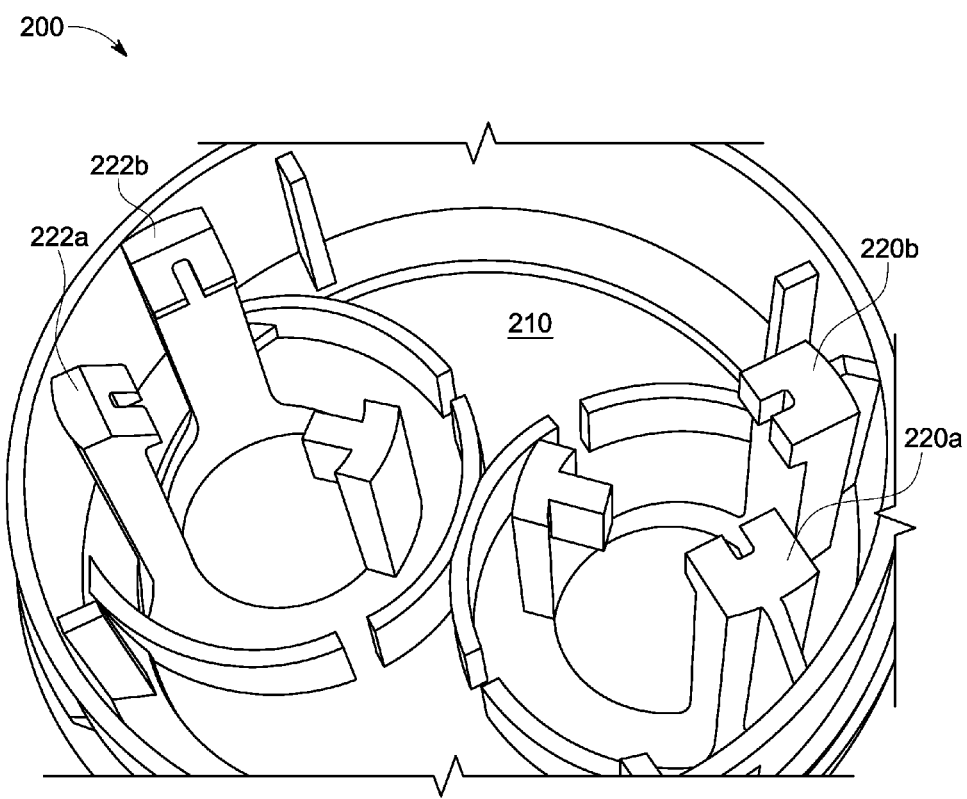
FIG. 2 depicts a collar in accordance with some embodiments.
Figure 3:
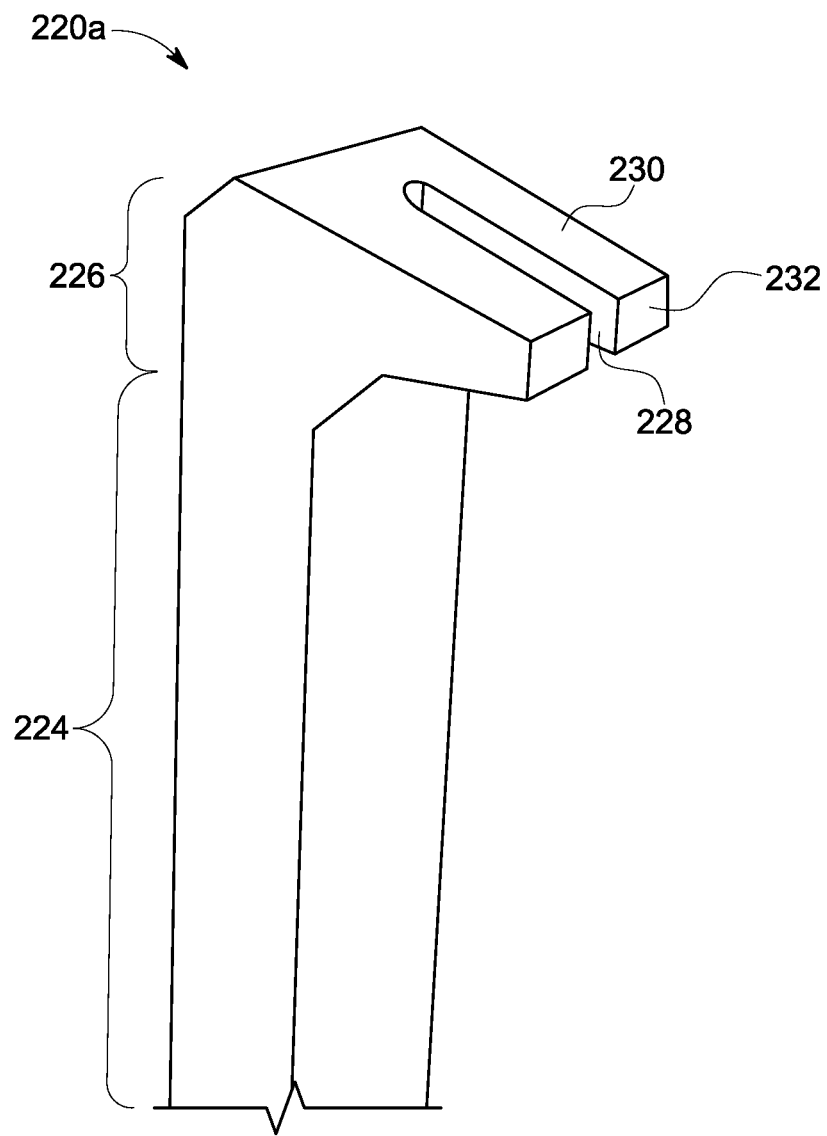
FIG. 3 depicts a connection pin in accordance with some embodiments.

FIG. 2 depicts collar 200 in accordance with some embodiments. Collar 200 can be made from one or more non-conductive materials such as rubber-like polymers, many plastics, porcelain, etc. Extending from internal surface 210 of the collar are connection pins 220a, 220b, 222a, 222b. With reference to FIG. 3, a connection pin in accordance with some embodiments is depicted. Each of the connection pins can include a shaft portion 224 extending from internal surface 210. At a distal end of the shaft portion is head portion 226 that includes a cantilevered portion extending away from the shaft portion.

The head portion has slot 228 which can be open-ended. In one implementation slot 228 can be a closed-ended slot (i.e., an aperture within the head portion). Lead-in wires 120 are press-fit into slot 228 to make a mechanical connection to the connection pin. In one implementation, slot 228 can be tapered so that the mechanical connection to the lead-in wires is achieved.

In accordance with some embodiments, head portion 226 can have a tapered outer surface 230 that forms narrow end 232 of the head portion at an end distal from where the head portion meets the shaft portion.

Depending on the light source technology a minimum of two lead-in wires are present (e.g., incandescent, LED). Accordingly, at least two of the connector pins include slot 228. In other implementations there is a correspondence between the lead-in wires for the particular light source technology and the number of connector pins having slot 228.

Figure 4:
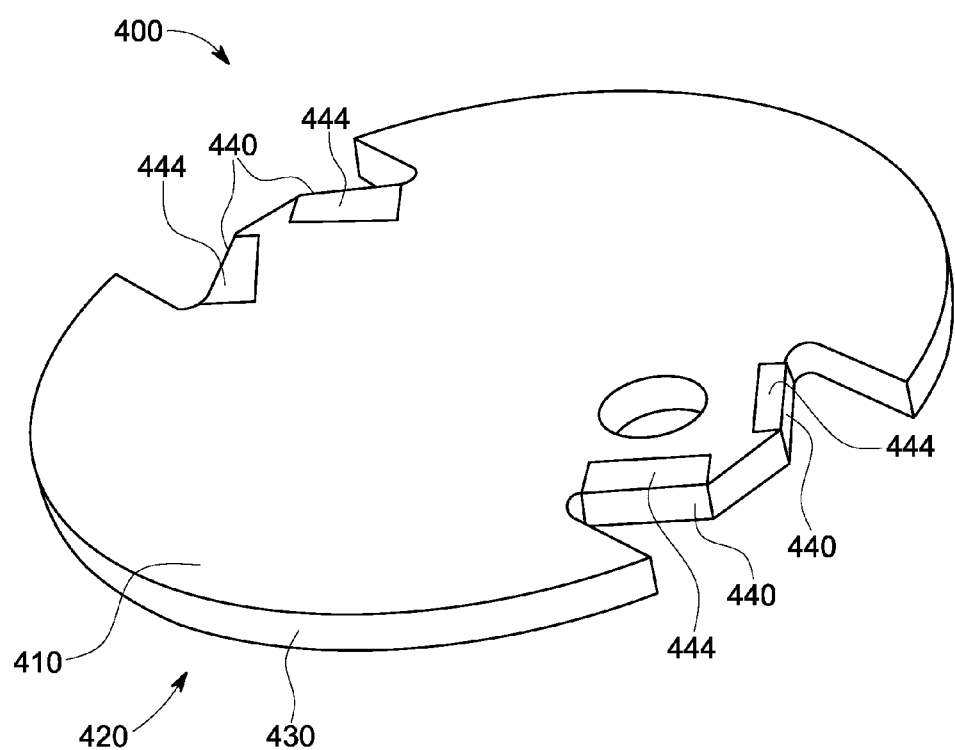
FIG. 4 depicts a printed circuit board in accordance with some embodiments.

FIG. 4 depicts printed circuit board (PCB) 400 in accordance with some embodiments. PCB 400 can be a planar board having two opposing surfaces 410, 420 and a rim 430 disposed between the opposing surfaces. PCB 400 has a shape and size designed to fit between the connection pins. Disposed on rim 430 are conductive surfaces 440 at locations that correspond to the positions of connection pins 220a, 220b, 222a, 222b. Conductive surfaces 440 can be formed by plating a via through-hole on a printed circuit board blank and then removing excess material so that PCB 400 includes conductive surfaces 440. In some embodiments, one or both of opposing surfaces 410, 420 can include conductive surfaces 444 that are in electrical communication with conductive surfaces 440.

Electrical contact between PCB 400 and lead-in wires 120 is accomplished by aligning two of conductive surfaces 440 against two corresponding connection pins, and applying pressure to the PCB so to exert force against the two pins while press-fitting (snapping) it into place against the remaining connection pins. As noted above, the PCB is shaped and sized to fit between the connection pins.

Alignment of conductive surfaces 440 (and if present conductive surfaces 444) with connection pins 220a, 220b, 222a, 222b form an electrical connection with the lead-in wires without needing to wrap, wind, twist, or solder the lead-in wires to the connection pins.

Figure 5:
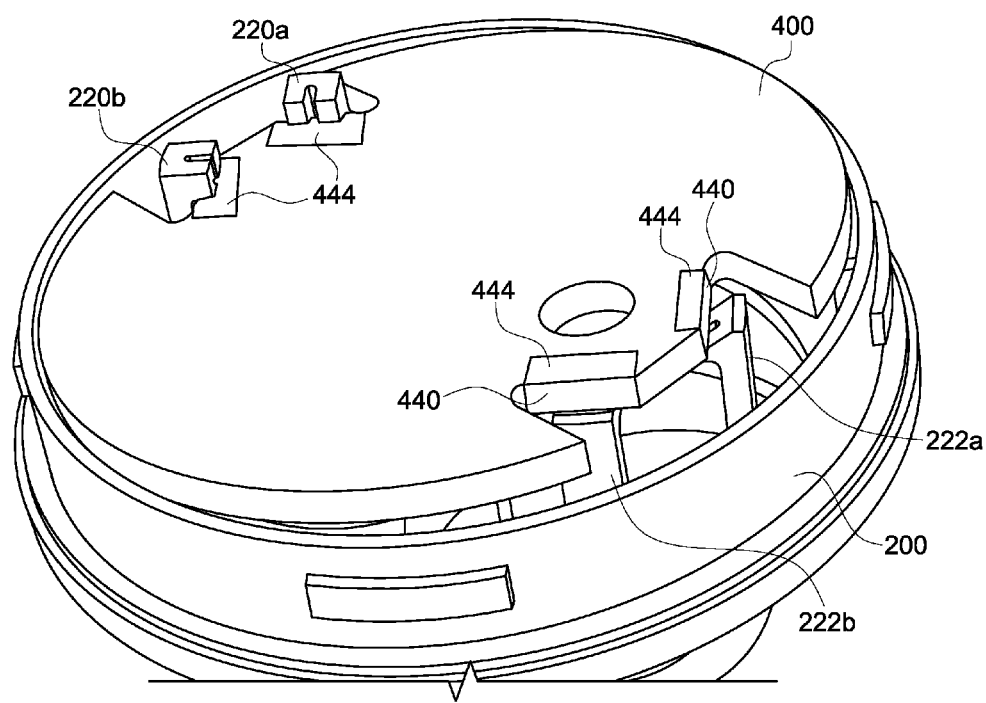
FIG. 5 depicts the printed circuit board of FIG. 4 and the collar of FIG. 2 in accordance with some embodiments.

FIG. 5 depicts PCB 400 in position against connection pins 220a, 220b and under respective head portions 226. Pressure on PCB 400 causes the PCB to slide along respective tapered outer surfaces 230 of connection pins 222a, 222b and snap into place under their respective head portions 226. Electrical contact is made between the lead-in wires and conductive surfaces 440 on rim 430 and conductive surfaces 444 on opposing surface 420. The PCB is held in a fixed position by a tensile force exerted by connection pins 220a, 220b, 222a, 222b against rim 430. In accordance with some embodiments, at least two connection pins are present to hold PCB 400 in a fixed position.

In accordance with some embodiments, connection pins 220a, 220b can also include tapered outer surfaces 230. In accordance with other implementations, connection pins 222a, 222b need not include tapered outer surfaces 230. In such implementations additional pressure on PCB 400 can spread the connection pins apart sufficient to have the PCB lodge between the connection pins.

Figure 6:
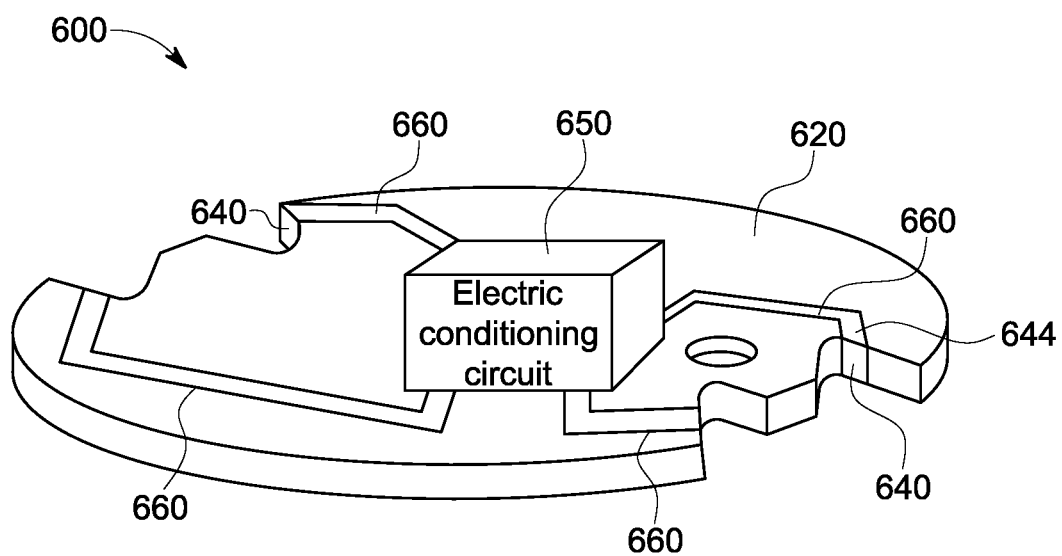
FIG. 6 depicts the printed circuit board of FIG. 4 in accordance with some embodiments.

FIG. 6 depicts PCB 600 in accordance with an embodiment. PCB 600 includes electrical conditioning circuit 650 on opposing surface 620. The electrical conditioning circuit is electrically coupled to conducting surfaces 640, 644 by conductive traces 660 on opposing surface 620. Lead-out wires (not shown) can be connected to electrical conditioning circuit 650. The lead-out wires can be electrically coupled to terminals on a conductive base. In one implementation, lead-out pins (not shown) can be connected to the electrical conditioning circuit and extending from an opposing surface of PCB 600.

Figure 7:
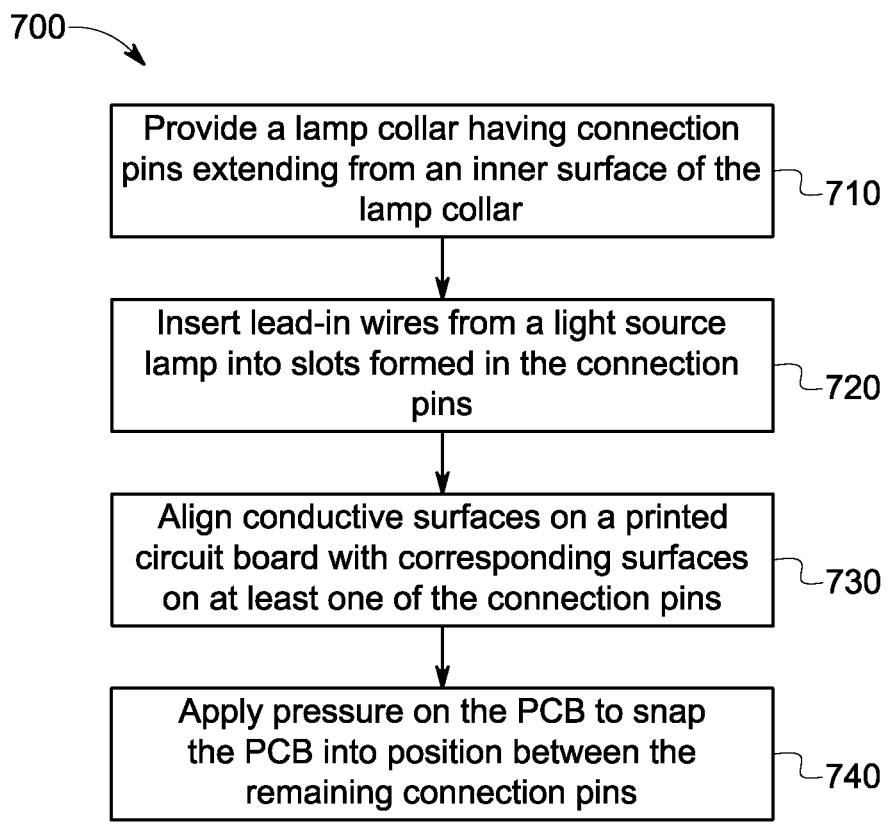
FIG. 7 depicts a process in accordance with some embodiments.

FIG. 7 depicts process 700 for assembling a lamp in accordance with some embodiments. A collar having connection pins extending from an inner surface is provided, step 710. The connection pins can include a shaft portion and a head portion that includes a cantilevered portion extending away from the shaft portion. The head portion can include a slot that can be either open-ended or forming an aperture in the head portion.

Lead-in wires from a light source are inserted, step 720, into the slots of the connection pin to make a mechanical connection to the connection pin. In one implementation, the slot can be tapered so that the mechanical connection to the lead-in wires is achieved.

Conductive surfaces on a printed circuit board are aligned, step 730, with corresponding surfaces on at least one of the connection pins. The PCB conductive surfaces can be on a rim of the PCB, as well as an opposing surface.

The conductive rim surface can be formed by plating a through-hole (i.e., a via) on a printed circuit board blank. Excess material is then removed so that a portion of the plated through-hole remains on the rim of the PCB. The size and configuration of the PCB is chosen so that it fits within the connection pins extending from the collar. In accordance with an embodiment, the rim conductive surface can be formed by mechanically affixing (e.g., solder, conductive or non-conductive adhesive, etc.) a conductive material to the rim surface and electrically coupling the conductive surface to a conductive surface on an opposing surface of the PCB.

Pressure is applied to the PCB, step 740, so that the PCB snaps, or slides, into position between the connection pins. The head portion of one or more of the connection pins can be tapered so that the PCB can more readily slide into position. A tensile force exerted on the PCB by the connection pins hold it in place. The PCB conductive surface forms an electrical connection with the lead-in wire inserted into the connection pin slot.

Although specific hardware and methods have been described herein, note that any number of other configurations may be provided in accordance with embodiments of the invention. Thus, while there have been shown, described, and pointed out fundamental novel features of the invention, it will be understood that various omissions, substitutions, and changes in the form and details of the illustrated embodiments, and in their operation, may be made by those skilled in the art without departing from the spirit and scope of the invention. Substitutions of elements from one embodiment to another are also fully intended and contemplated. The invention is defined solely with regard to the claims appended hereto, and equivalents of the recitations therein.

The invention claimed is:

1. A lamp comprising:
   a collar having an internal surface and an outer surface;
   two or more connection pins extending from the internal surface of the collar, at least two connection pins having a head portion distal from the internal surface of the collar;
   the head portions including a slot;
   a light source having a body and at least two lead-in wires external to the body;
   each of the at least two lead-in wires located within respective slots on respective connection pins, wherein the lead-in wires are mechanically coupled in a press-fit manner;
   a printed circuit board having two opposing surfaces and a rim disposed between the two opposing surfaces;
   two or more conductive surfaces disposed on at least one of the rim and one of the opposing surfaces, a position of each conductive surface corresponding to a position of the at least two connection pins having slots; and
   the printed circuit board located between the at least two connection pins, wherein the printed circuit board secures the mechanical coupling of the lead-in wires and corresponding disposed conductive surfaces are in electrical communication with the lead-in wires.

2. The lamp of claim 1, further comprising the printed circuit board having a shape and size configured to fit between the connection pins.

3. The lamp of claim 1, if conductive surfaces are disposed on the rim further comprising a conductive surface disposed on one of the opposing surfaces of the printed circuit board at a position corresponding to the location of respective connection pins, the opposing surface conductive surface in electrical communication with the lead-in wire inserted in the slot of respective connection pins.

4. The lamp of claim 1, if conductive surfaces are disposed on one of the opposing surfaces further comprising a conductive surface disposed on one of the rim of the printed circuit board at a position corresponding to the location of respective connection pins, the rim surface conductive surface in electrical communication with the lead-in wire inserted in the slot of respective connection pins.

5. The lamp of claim 4, wherein the conductive surface on the rim includes a conductive material affixed to the rim and in electrical communication with a conductive surface on an opposing surface.

6. The lamp of claim 1, further comprising the slot being one of an open-ended slot or a closed-ended slot.

7. The lamp of claim 1, further comprising a tapered outer surface on the head portion of at least one of the connection pins.

8. The lamp of claim 1, further comprising the collar formed from a non-conductive material.

9. The lamp of claim 1, further comprising an electrical input conditioning circuit and conductive traces on an opposing surface of the printed circuit board, the electrical input conditioning circuit in electrical communication with the lead-in wires along the conductive traces.

10. The lamp of claim 1, wherein the lead-in wires are mechanically coupled in a press-fit manner free of wrapping, winding, twisting, or soldering.

11. A method of assembling a lamp, the method comprising:

providing a collar having internal and outer surfaces, wherein two or more connection pins extend from the internal surface, at least two connection pins each having a slot distal from the collar internal surface;

pressing respective lead-in wires of a light source into respective slots to form a mechanical connection with the slot;

providing a printed circuit board having two opposing surfaces and a rim disposed between the two opposing surfaces, wherein two or more conductive surfaces are disposed on at least one of the rim and one of the opposing surfaces at positions corresponding to a position of the at least two connection pins having slots; and aligning the printed circuit board between the at least two connection pins, wherein the printed circuit board secures the mechanical coupling of the lead-in wires and corresponding conductive surfaces are in electrical communication with the lead-in wires.

12. The method of claim 11, further including:
plating a through-hole on a printed circuit board blank; and
removing excess material from the blank along a circumference of the printed circuit board to form the rim conductive surface.

13. The method of claim 11, further including:
mechanically affixing a conductive material to the rim; and
forming an electrical connection between the conductive material and the disposed conductive surfaces on the opposing surfaces.

14. The method of claim 11, wherein at least a portion of the connection pins include a distal head portion with a tapered outer surface.

15. The method of claim 11, further including disposing conductive surfaces on an opposing surface of the printed circuit board, the opposing surface conductive surfaces in electrical communication with the rim conductive surfaces.

16. The method of claim 11, further including:
mounting an electrical input conditioning circuit on a printed circuit opposing surface; and
disposing conductive traces on at least one printed circuit opposing surface, wherein the electrical input conditioning circuit is electrically coupled to the lead-in wires along the conductive traces.

17. The method of claim 11, wherein the step of pressing respective lead-in wires of a light source into respective slots forms a mechanical connection with the slot free of wrapping, winding, twisting, or soldering.

* * * * *